(12) United States Patent
Jeon

(10) Patent No.: US 7,763,956 B2
(45) Date of Patent: Jul. 27, 2010

(54) SEMICONDUCTOR AND METHOD FOR MANUFACTURING THE SAME

(75) Inventor: Haeng Leem Jeon, Anyang-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/848,640

(22) Filed: Aug. 31, 2007

(65) Prior Publication Data
US 2008/0054376 A1    Mar. 6, 2008

(30) Foreign Application Priority Data
Aug. 31, 2006    (KR) ...................... 10-2006-0083916

(51) Int. Cl.
*H01L 29/00*    (2006.01)
(52) U.S. Cl. .............................. 257/550; 257/E21.633; 438/163
(58) Field of Classification Search .......... 257/E21.633, 257/550; 438/163
See application file for complete search history.

(56) References Cited

U.S. PATENT DOCUMENTS

| 5,710,055 | A | * | 1/1998 | Kizilyalli | ................... 438/289 |
| 5,821,147 | A | * | 10/1998 | Kizilyalli | ................... 438/305 |
| 6,063,682 | A | * | 5/2000 | Sultan et al. | ................. 438/305 |
| 6,331,458 | B1 | * | 12/2001 | Anjum et al. | ................ 438/197 |
| 6,362,063 | B1 | * | 3/2002 | Maszara et al. | ............. 438/307 |
| 6,642,589 | B2 | * | 11/2003 | Wada et al. | .................. 257/397 |
| 7,211,516 | B2 | * | 5/2007 | Chen et al | ................... 438/682 |
| 2001/0031522 | A1 | * | 10/2001 | Stolk et al. | .................. 438/199 |

FOREIGN PATENT DOCUMENTS

KR    10-2001-0037813    1/2003

* cited by examiner

*Primary Examiner*—David Vu
*Assistant Examiner*—Brandon Fox
(74) *Attorney, Agent, or Firm*—Saliwanchik, Lloyd & Saliwanchik

(57) ABSTRACT

A semiconductor device and a method of fabricating same are provided. According to an embodiment, a gate insulating layer and a gate are sequentially formed on a substrate, and a pocket ion implant region is formed at sides and below a portion of the gate at a predetermined depth in the substrate. An LDD ion implant region can be formed between the pocket ion implant region and the surface of the substrate. A spacer is formed on sides of the gate, and a deep source/drain region is formed by ion-implanting $BF_2$ within the substrate at sides of the spacer.

6 Claims, 3 Drawing Sheets

SEMICONDUCTOR AND METHOD FOR MANUFACTURING THE SAME

CROSS-REFERENCE TO RELATED APPLICATION

The present application claims the benefit under 35 U.S.C. §119 of Korean Patent Application No. 10-2006-0083916, filed Aug. 31, 2006, which is hereby incorporated by reference in its entirety.

BACKGROUND

Currently, in a process for manufacturing a CMOS FET device, as the size of the device becomes smaller, a sidespacer wall width applied as a hard mask for a deep source/drain ion implant also becomes smaller.

Thereby, the influence due to a lateral diffusion of the deep source/drain dopant is reflected in the electrical characteristics of the device (reduction in Vth and increase in leakage current).

In particular, in the case of a PMOS, since a deep source/drain ion implant process typically uses light boron, it is considered to be more fragile from the influence of the lateral diffusion from the deep source/drain, as compared to an NMOS.

Meanwhile, an attempt to reduce the channeling in a vertical or a depth direction has been made during implanting the dopant into the source/drain. In particular, a substrate is preamorphized by implanting ions vertical to the substrate into a desirable position. Such an ion implant is referred to as a preamorphization implantation.

As a result, a junction portion is made to be shallow in a vertical direction so that the short channel characteristic of the device is improved.

However, the junction depth is reduced to the size of about 30 nm or less, and any disadvantages due to the reduced junction depth may occur.

In other words, because of the reduced junction depth, dopant activity is restricted by means of silicide and the resistance (Rsd) of the source/drain is increased. The advantages obtained by the shallow junction are offset by means of the above disadvantages. Therefore, there is an increasing demand for a technology improving the scalability of the MOSFETs, in particular, the CMOS devices, in designing a ULSI (ultra large scale integrated) circuit without the problems and disadvantages in the related art such as the increase of the source/drain resistance and improving short channel characteristic including a threshold voltage (Vt) roll off.

BRIEF SUMMARY

Embodiments of the present invention provide a manner for reducing the influence caused by means of a lateral diffusion of a deep source/drain. An embodiment addresses the effect on the performance of a device as a sidespacer wall width of a CMOS FET device; in particular, a PMOS reduces in size. According to an embodiment, a method is provided for securing a margin of a sidewall spacer forming process.

Embodiments of the present invention provide a semiconductor device and a method for manufacturing thereof capable of minimizing the degradation in performance of a PMOS device due to a lateral diffusion and securing a process margin of a sidespacer wall width by applying indium and $BF_2$ relatively heavier than boron, unlike a process forming a deep source/drain by applying only boron in an existing PMOS device.

A semiconductor device according to an embodiment comprises: a gate insulating layer and a gate sequentially formed on a substrate; a pocket ion implant region formed at sides and below the gate at a predetermined depth in the substrate; an LDD ion implant region formed between the pocket ion implant region and the surface of the substrate; a spacer formed on sides of the gate; and a deep source/drain region formed by ion-implanting $BF_2$ within the substrate at sides of the spacer.

Also, a method for manufacturing a semiconductor device according to an embodiment comprises: sequentially forming a gate insulating layer and a gate on a substrate; forming a pocket ion implant region at sides and below the gate at a predetermined depth in the substrate; forming an LDD ion implant region formed between the pocket ion implant region and the surface of the substrate; forming a spacer on sides of the gate; and forming a deep source/drain region by ion-implanting $BF_2$ within the substrate using the spacer as an ion implant mask.

DETAILED DESCRIPTION

Hereinafter, a semiconductor device and a method for manufacturing the same according to an embodiment of the present invention will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
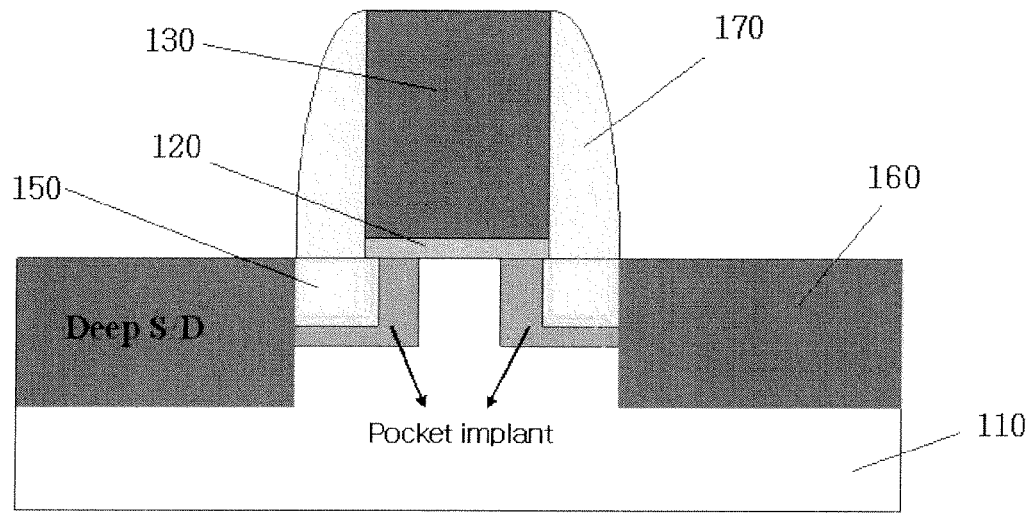
FIG. 1 is a cross-sectional view of a semiconductor device according to an embodiment of the present invention.

FIG. 1 is a cross-sectional view of a semiconductor device according to a first embodiment.

Referring to FIG. 1, a substrate 110 can be provided with a gate insulating layer 120 and a gate 130.

A pocket ion implant region 140 can be located in the substrate 110 at both sides and below a portion of the gate 130 at a predetermined depth. In addition, an LDD ion implant region 150 can be formed between the pocket ion implant region 140 and the surface of the substrate 110.

A spacer 170 can be on sides of the gate 130 and a deep source/drain region 160 can be formed by ion-implanting $BF_2$ within the substrate at sides of the spacer 170.

In an embodiment, the deep source/drain region 160 can further be implanted with indium (In).

The indium (In) is heavier than the $BF_2$, and is ion-implanted in a shallower depth.

The deep source/drain region 160 can be formed in a depth of 50 to 100 nm from the surface of the substrate 110 by means of the ion implant of the indium (In) and the $BF_2$.

At this time, the ion implant process conditions of the indium and the $BF_2$ for forming the deep source/drain region 160 can be determined considering characteristics such as junction depth, gate poly thickness, an activation condition, and junction leakage.

When the indium and the $BF_2$ are applied, the degradation in performance of the device due to the lateral diffusion can be inhibited and the formation of the shallow junction can more easily be made.

In addition, the process margin for the change in the sidespacer wall width can be secured.

Also, an advantage occurs where the ion implanted region has a preamorphization implantation effect by ion-implanting the indium.

FIGS. 2 to 5 are cross-sectional views of a process for manufacturing a semiconductor device according to an embodiment.

Figure 2:
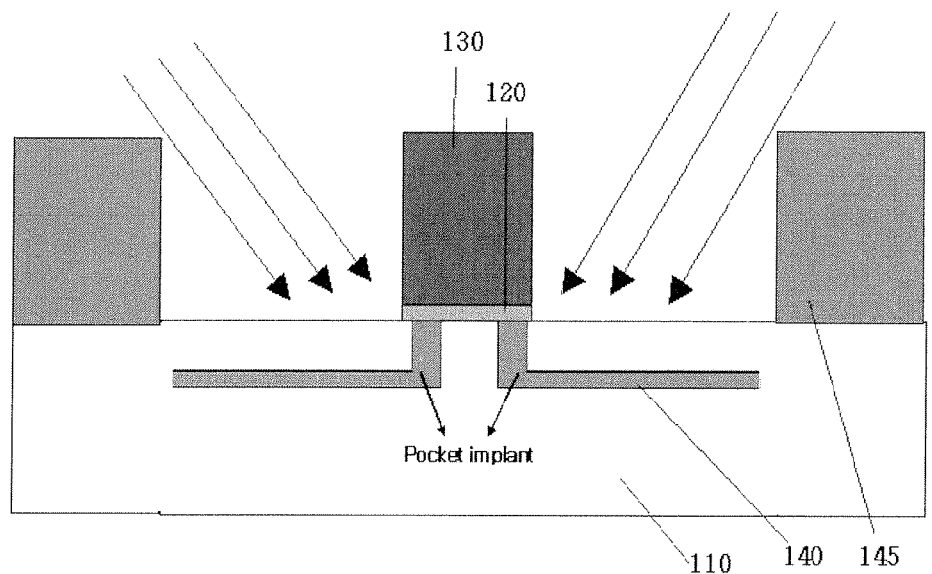
FIGS. 2 to 5 are cross-sectional views of a fabricating process according to an embodiment of the present invention.

Referring to FIG. 2, a gate insulating layer 120 and a gate 130 can be sequentially formed on a substrate 110.

Thereafter, a pocket ion implant region 140 can be formed at sides and below a portion of the gate 130 at a predetermined depth. To form the pocket ion implant region 140, a photo resist pattern 145 can be formed in a portion into which impurity is not to be implanted, that is, an impurity implant blocking region. Then, a pocket ion implant can be performed by implanting impurity ions at a predetermined angle to the substrate 110.

Figure 3:
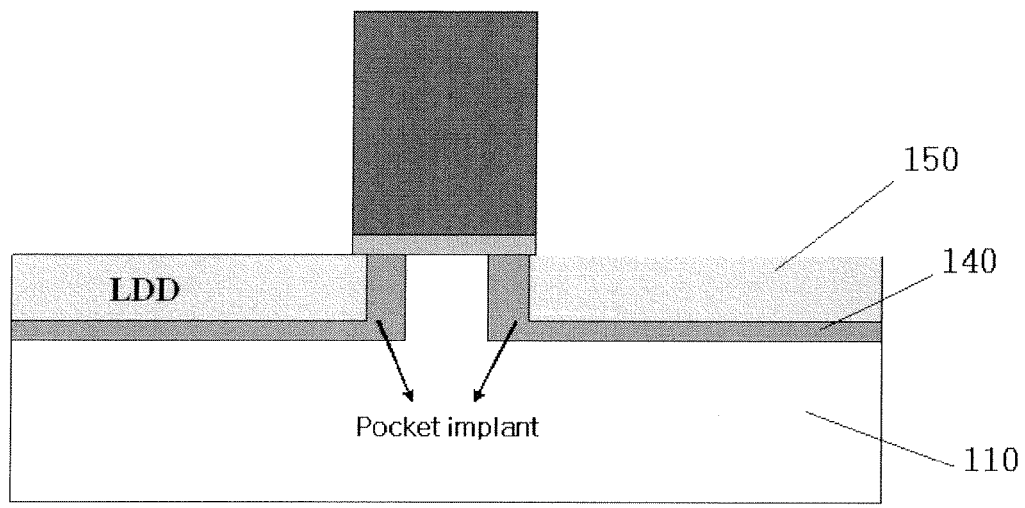

Next, referring to FIG. 3, an LDD (lightly doped drain) ion implant region 150 can be formed between the pocket ion implant region 140 and the surface of the substrate 110.

Figure 4:
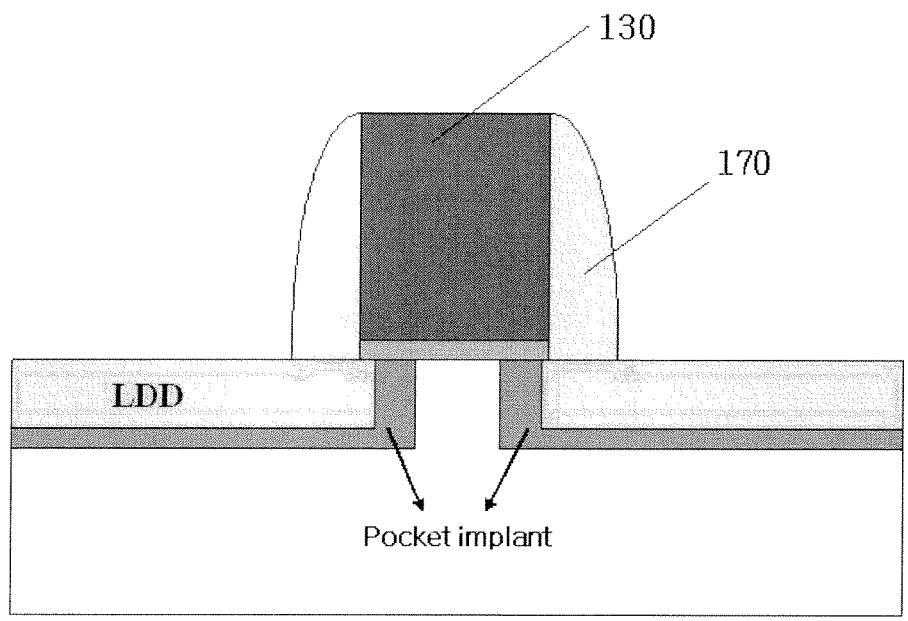

Then, referring to FIG. 4, a spacer 170 can be formed on sides of the gate 130.

Figure 5:
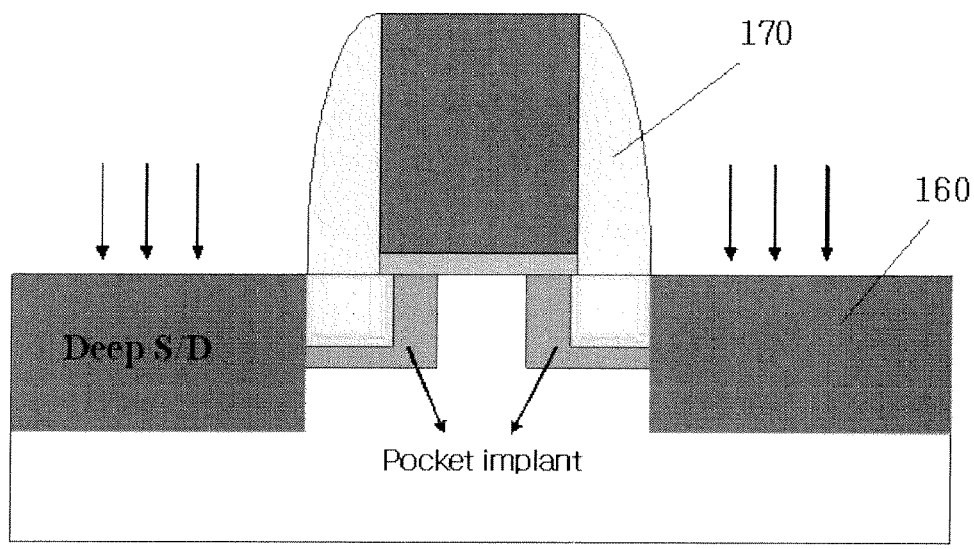

Referring to FIG. 5, a deep source/drain region 160 can be formed by ion-implanting $BF_2$ within the substrate 110 at sides of the spacer 170 using the spacer 170 and gate 130 as the ion implant mask.

A rapid thermal processing (RTA or SKIP) can be performed after ion-implantation. The SKIP is a more rapid thermal process than the RTA, and is a thermal process that inhibits movement of dopant.

In a further embodiment, indium (In) can be ion-implanted into the substrate when forming the source/drain region.

In one embodiment, the indium is first ion-implanted and then $BF_2$ is ion-implanted into the substrate.

In particular, the indium can be ion-implanted first so that an effect of a preamorphization implantation can be achieved. As a result, when ion-implanting the $BF_2$, a separate preamorphization implantation may be not performed.

According to an embodiment, the indium is ion-implanted at an implantation energy of 10 to 150 KeV, and the $BF_2$ can be ion-implanted at an implantation energy of 20 to 40 KeV so that the source/drain region 160 is formed to a depth of 50 to 100 nm.

By implanting indium and $BF_2$, the degradation in performance due to the lateral diffusion as described above can be inhibited and the formation of the shallow junction can more easily be achieved.

In addition, the process margin for the change in the sidespacer wall width can be secured.

As described above, with the semiconductor device and the method for manufacturing the same according to an embodiment, the degradation in performance of the device due to the lateral diffusion in the PMOS can be reduced.

Also, with an embodiment, the formation of the ultrashallow junction can more easily be achieved.

Also, with an embodiment, the margin of the sidespacer wall width can sufficiently be secured.

In addition, with an embodiment, the preamorphization implantation can be achieved by ion-implanting indium.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device comprising:
   sequentially forming a gate insulating layer and a gate on a substrate;
   forming a pocket ion implant region at sides and below a portion of the gate in the substrate at a predetermined depth;
   forming a lightly doped drain (LDD) ion implant region between the pocket ion implant region and the surface of the substrate after forming the pocket ion implant region;
   forming a spacer on sides of the gate; and
   forming a deep source/drain region by ion-implanting $BF_2$ and indium into the substrate using the spacer as an ion implant mask, wherein the indium is ion-implanted to a shallower depth than the $BF_2$.

2. The method according to claim 1, further comprising performing a rapid thermal process after ion-implanting $BF_2$.

3. The method according to claim 1, wherein ion-implanting the indium is performed before ion-implanting the $BF_2$.

4. The method according to claim 1, wherein the indium is ion-implanted at an implantation energy of 10 to 150 KeV and the $BF_2$ is ion-implanted at an implantation energy of 20 to 40 KeV.

5. The method according to claim 1, wherein the deep source/drain region is formed to a depth of 50 to 100 nm from the surface of the substrate.

6. The method according to claim 1, wherein ion-implanting the indium provides a preamorphization of the substrate.

* * * * *